(12) United States Patent
Saino et al.

(10) Patent No.: US 6,514,032 B1
(45) Date of Patent: Feb. 4, 2003

(54) SUBSTRATE TRANSFER SYSTEM

(75) Inventors: Kousaku Saino, Kasaoka (JP); Takahiro Kobiki, Fukuyama (JP)

(73) Assignee: Tazmo Co., Ltd., Okayama (JP)

( * ) Notice: Subject to any disclaimer, the term of this patent is extended or adjusted under 35 U.S.C. 154(b) by 0 days.

(21) Appl. No.: 09/689,422

(22) Filed: Oct. 12, 2000

(30) Foreign Application Priority Data

Feb. 1, 2000 (JP) ........................................ 2000-023618

(51) Int. Cl.[7] .............................................. B66C 23/00
(52) U.S. Cl. ............................... 414/744.1; 414/744.4; 74/490.01; 901/14; 901/15
(58) Field of Search .......................... 414/744.1, 744.2, 414/744.5, 744.6, 901; 74/490.01, 490.06; 318/568.11; 901/15, 14

(56) References Cited

U.S. PATENT DOCUMENTS

| | | | |
|---|---|---|---|
| 5,007,784 A | 4/1991 | Genov et al. | |
| 5,049,029 A | 9/1991 | Mitsui et al. | |
| 5,064,340 A | * 11/1991 | Genov et al. | ............ 414/744.5 |
| 5,443,354 A | 8/1995 | Stone et al. | |
| 5,525,027 A | 6/1996 | Jinno et al. | |
| 5,534,761 A | 7/1996 | Crippa | |
| 5,640,883 A | 6/1997 | Takizawa | |
| 5,771,748 A | 6/1998 | Genov et al. | |
| 5,775,170 A | 7/1998 | Genov et al. | |
| 5,789,890 A | 8/1998 | Genov et al. | |
| 5,839,322 A | 11/1998 | Genov et al. | |
| 5,857,826 A | 1/1999 | Sato et al. | |
| 6,121,743 A | * 9/2000 | Genov et al. | ........... 318/568.11 |
| 6,199,444 B1 | 3/2001 | Wakaizumi et al. | |

FOREIGN PATENT DOCUMENTS

| | | |
|---|---|---|
| JP | 8-274140 | 10/1996 |
| JP | 9-285982 | 11/1997 |

* cited by examiner

*Primary Examiner*—Kathy Matecki
*Assistant Examiner*—Michael Lowe
(74) *Attorney, Agent, or Firm*—Jordan and Hamburg LLP

(57) ABSTRACT

A substrate transfer system employs a robot hand which is composed such that a sum length of a first arm and a third arm equal a length of a second arm, and a length of the first arm becomes longer than a length of the third arm. A ratio between arm lengths is determined such that a distal end portion of the first arm, a distal end portion of the second arm, a distal end portion of the third arm, and a distal end portion of the workpiece held by the end effector are inscribed in a track circle around a rotational axis of the first arm as a center. The ratio of the first, second and third arm lengths is approximately $1:(\sqrt{5}+1)/2:(\sqrt{5}-1)/2$. This optimized ratio of the arm lengths allows the arm rotational radius to be smaller than the conventional value, and makes it possible to achieve a longer transfer distance in an equal installation area.

3 Claims, 10 Drawing Sheets

SUBSTRATE TRANSFER SYSTEM

BACKGROUND OF THE INVENTION

This invention relates generally to a substrate transfer system for transferring a workpiece such as a silicon (Si) wafer, a glass rectangular substrate for a photomask, a glass rectangular substrate for liquid crystal.

A substrate transfer system employing a conventional robot hand for transferring said workpiece is shown in FIG. 6. The substrate transfer system comprises a base 1 in which a driving source is built in, and a robot hand 2 that is mounted on said base 1. The robot hand 2 has a 3-link structure that is provided with a first arm 3, a second arm 4, a third arm 5 and an end effector 6 for supporting a workpiece W. This kind of the substrate transfer system is, as shown in U.S. Pat. No. 5,064,340, uniquely structured such that lengths of first, second and third arms maintain a ratio of 1:2:1 respectively (a=c, b=2a).

Further, as shown in FIG. 7, when an end effector part 7 including the workpiece W moves in a straight line, a middle point 14 that divides the second arm 4 into halves in a longitudinal direction, moves so as to lie in a line between a rotational axis 15 of the end effector 6 and a rotational axis 13 of the first arm 3. Besides, in order for the end effector part 7 including the workpiece W to move in a straight line, rotational speed of arms and end effector is controlled so as to maintain a ratio of 1:2:2:1. Rotational tracks around the rotational axis 13 as a center and a linear state of the arms are indicated by phantom lines in the figure.

In recent years, in order to enhance productivity, the need for reducing an installation area has increased for a substrate processing equipment in which a substrate transfer system is equipped. Therefore, an area for the substrate transfer system is also limited in the substrate processing equipment. Thus, there has been an important object that the substrate transfer system achieves required functions in a minimum installation area.

However, the installation area of the substrate transfer system having a robot hand of a 3-link structure is determined by a minimum rotational radius of arm rotation. The conventional substrate transfer system is, as shown in FIG. 7, uniquely structured such that lengths of the first, second and third arms 3, 4 and 5 maintain a ratio of 1:2:1 respectively, so that the minimum rotational radius of arm rotation can theoretically be calculated by following equations with respect to a rotational angle $\theta$ ($\theta$ is an angle between the first arm direction and a substrate transferring direction) of the first arm 3 when the robot hand is contracted.

In order to give a straight line motion to the end effector part including a workpiece, it is assumed that the rotational speed of each of the arms and end effector is controlled to maintain a ratio of 1:2:2:1, so that the first arm 3 and third arm 5 always keeps a parallel state regardless of the rotational angle $\theta$ of the first arm 3. The rotational radius takes either one of rotational track radiuses (R1, R2 and R3) with respect to the area of the rotational angle $\theta$ of the first arm 3 when the robot hand is contracted. R1 is the rotational track radius of the distal end portion of the second arm 4 around the rotational axis of the first arm 3 as a center. R2 is the rotational track radius of the distal end portion of the third arm 5 around the rotational axis of the first arm 3 as a center. R3 is the rotational track radius of the distal end portion of the workpiece W around the rotational axis of the first arm 3 as a center. Each of the rotational track radiuses (hereinafter referred to as rotational radius) is determined based on FIG. 7 by the following equations:

$$R1 = w/2 + a \cdot \sin\theta / \sin\{\tan^{-1}(\tan\theta/3)\}$$

$$R2 = 4a \cdot \cos\theta + w/2$$

$$R3 = e + d/2 - 4a \cdot \cos\theta$$

Here, conditions are assumed as follows:
a: length of the first arm
b: length of the second arm (=2a)
c: length of the third arm (=a)
e: length of the end effector (const.)
w: width of the arm (const.)
d: diameter of the circular thin workpiece (const.)

The above equation is obtained in a method below when a segment length of a side OA is assumed to be x in a hatched triangle of FIGS. 8(a) and 8(b) showing details of segments of FIG. 7:

$$x \cdot \sin\phi = b/2 \cdot \sin\theta$$

$$x = b/2 \cdot \sin\theta / \sin\phi = a \cdot \sin\theta / \sin\phi$$

Here, $$\overline{QO} = \overline{BQ} = 2a \cdot \cos\theta$$

$$\overline{PQ} = a \cdot \cos\theta$$

$$\therefore \overline{PO} = \overline{PQ} + \overline{QO} = 3a \cdot \cos\theta$$

And, $$\overline{AP} = b/2 \cdot \sin\theta = a \cdot \sin\theta$$

In $\triangle APO$, $$\tan\phi = \overline{AP}/\overline{PO} = a \cdot \sin\theta / 3a \cdot \cos\theta$$

$$\therefore \phi = \tan^{-1}(\tan\theta/3)$$

Substituting this value into the above equation about x, $$x = a \cdot \sin\theta / \sin\{\tan^{-1}(\tan\theta/3)\}$$

Here, R1 = w/2 + x

The maximum value among R1, R2 and R3 that is determined by the above equation becomes the rotational radius R in a time for rotation of the first arm 3 when the robot hand is contracted. The rotational radius R is determined by the following equation:

$$R = \text{MAX}(R1(\theta), R2(\theta), R3(\theta))$$

The minimum value Rmin in the above equation is the minimum rotational radius that is to be obtained.

For instance, in a conventional example shown in FIG. 9 (equal to FIG. 7, dimensions are described), the rotational radius R in each of $\theta$ is indicated as shown in a graph of FIG. 10 (horizontal axis: rotational angle of the first arm 3, vertical axis: rotational radius). At the time, the minimum value Rmin=249.696 mm ($\theta$=72.946 deg) of a curve R is the minimum rotational radius in the conventional example shown in FIG. 9.

As described above, in the conventional example in which the ratio between the first, second and third arm lengths is 1:2:1, it is theoretically impossible that the rotational radius takes on a smaller value than the above minimum value Rmin.

SUMMARY OF THE INVENTION

This invention is made to solve the above-mentioned problems. One object of the present invention is to provide a substrate transfer system which allows a rotational radius of arms to be smaller than that of a conventional system, and achieves longer transfer distance in an installation area equal to a conventional installation area, thereby making it possible to contribute toward reduction of the installation area of a substrate processing equipment.

In order to achieve the above-mentioned objects, according to one aspect of the present invention, a substrate transfer system transfers a workpiece such as a silicon wafer, a glass rectangular substrate for a photomask, a glass rectangular substrate for liquid crystal with employing a robot hand: wherein said robot hand comprises a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm; and wherein each of the arms are composed such that a sum length of the first arm and third arm becomes equal to a length of the second arm, and a length of the first arm becomes longer than a length of the third arm.

The above-mentioned composition allows the arm rotational radius to be smaller than a rotational radius of a conventional system, and makes it possible to achieve a longer transfer distance in an equal installation area, thereby contributing toward reduction of an installation area of a substrate processing equipment.

According to another aspect of the present invention, a substrate transfer system transfers a workpiece such as a silicon wafer, a glass rectangular substrate for a photomask, a glass rectangular substrate for liquid crystal with employing a robot hand: wherein said robot hand comprises a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm; wherein a ratio between each of arm lengths is determined such that a distal end portion of the first arm, a distal end portion of the second arm, a distal end portion of the third arm, and a distal end portion of the workpiece held by the end effector is inscribed in a track circle around a rotational axis of the first arm as a center; and wherein the ratio between each of arm lengths is approximately $1:(\sqrt{5}+1)/2(\sqrt{5}-1)/2 (\approx 1:1.618:0.618)$.

According to further aspect of the present invention, a substrate transfer system transfers a workpiece such as a silicon wafer, a glass rectangular substrate for a photomask, a glass rectangular substrate for liquid crystal with employing a robot hand: wherein said robot hand comprises a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm; wherein a ratio between each of arm lengths is determined such that a distal end portion of the first arm, a distal end portion of the second arm, a distal end portion of the third arm, and a distal end portion of the workpiece held by the end effector is inscribed in a track circle around a rotational axis of the first arm as a center; and wherein the ratio between each of arm lengths is approximately determined such that a longer portion of the divided second arm length according to "golden section" becomes the first arm length, and a lesser portion of it becomes the third arm length.

In the above-mentioned composition, a theoretical minimum value of the minimum rotational radius can be provided. Especially, this composition makes it possible to provide a theoretical minimum value of the minimum rotational radius in the substrate transfer system wherein each of arm lengths is structured such that the sum of the first and third arm lengths equals the second arm length, and the first arm length becomes longer than the third arm length.

DETAILED DESCRIPTION OF THE PREFERRED EMBODIMENT OF THE PRESENT INVENTION

Figure 1:
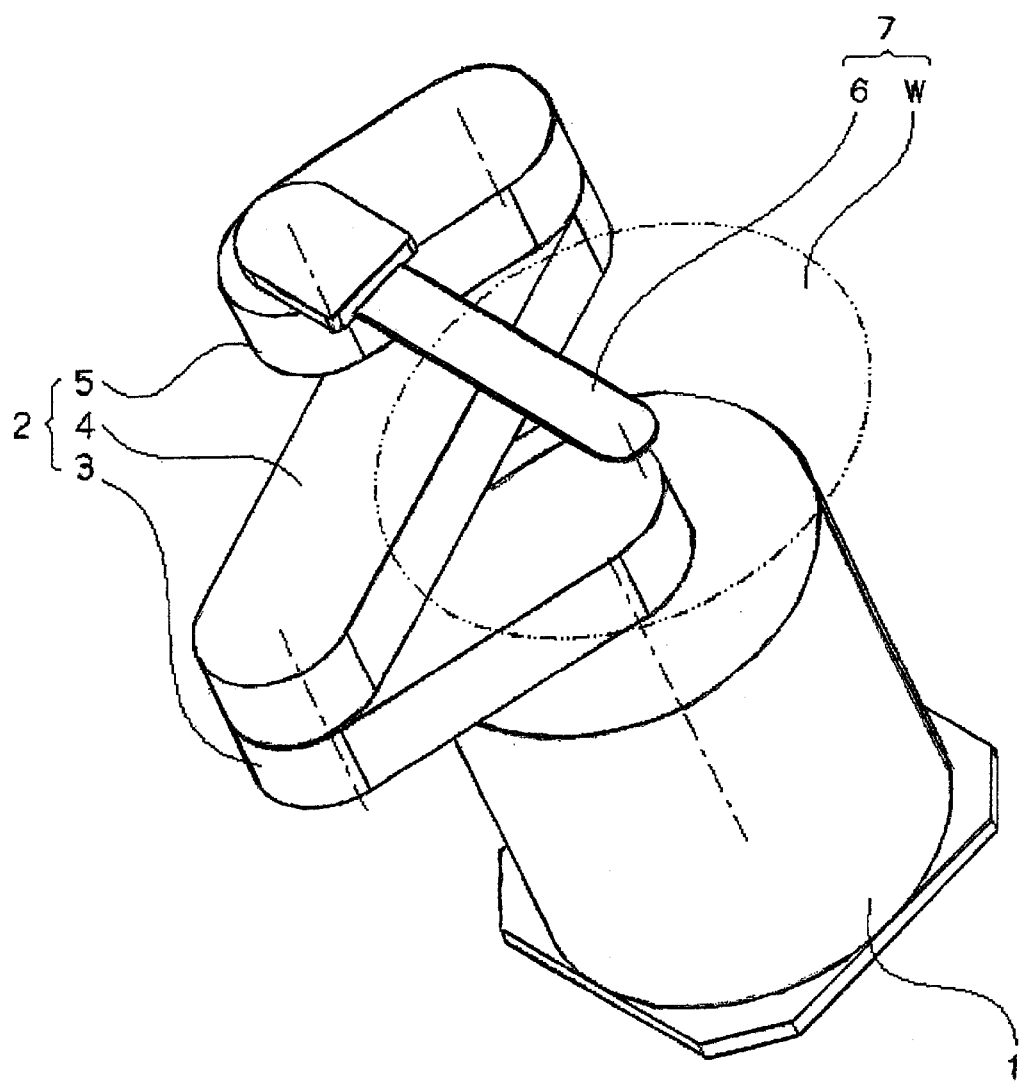
FIG. 1 is a perspective view of a substrate transfer system according to one embodiment of the present invention.

Now, a substrate transfer system according to one embodiment of the present invention will be explained with reference to the drawings. In FIG. 1, the substrate transfer system comprises a base 1 in which a driving source is built, and a robot hand 2 which is mounted on said base 1. The robot hand 2 is provided with a 3-link structure including a first arm 3, a second arm 4, a third arm 5, and an end effector 6 for supporting a workpiece W. In order to make the difference between the system of the present invention and a conventional system in a ratio between lengths of the first, second and third arms 3, 4 and 5, and control a rotational radius in an arm extension motion to the smallest, the structure is composed such that the sum of the first arm 3 length and the third arm 5 length equals the second arm 4 length wherein the first arm 3 length becomes longer than the third arm 5 length. This composition makes it possible to control the rotational radius to the smallest in a state that the arms of the robot hand contract into predetermined angles as explained later.

Figure 2:
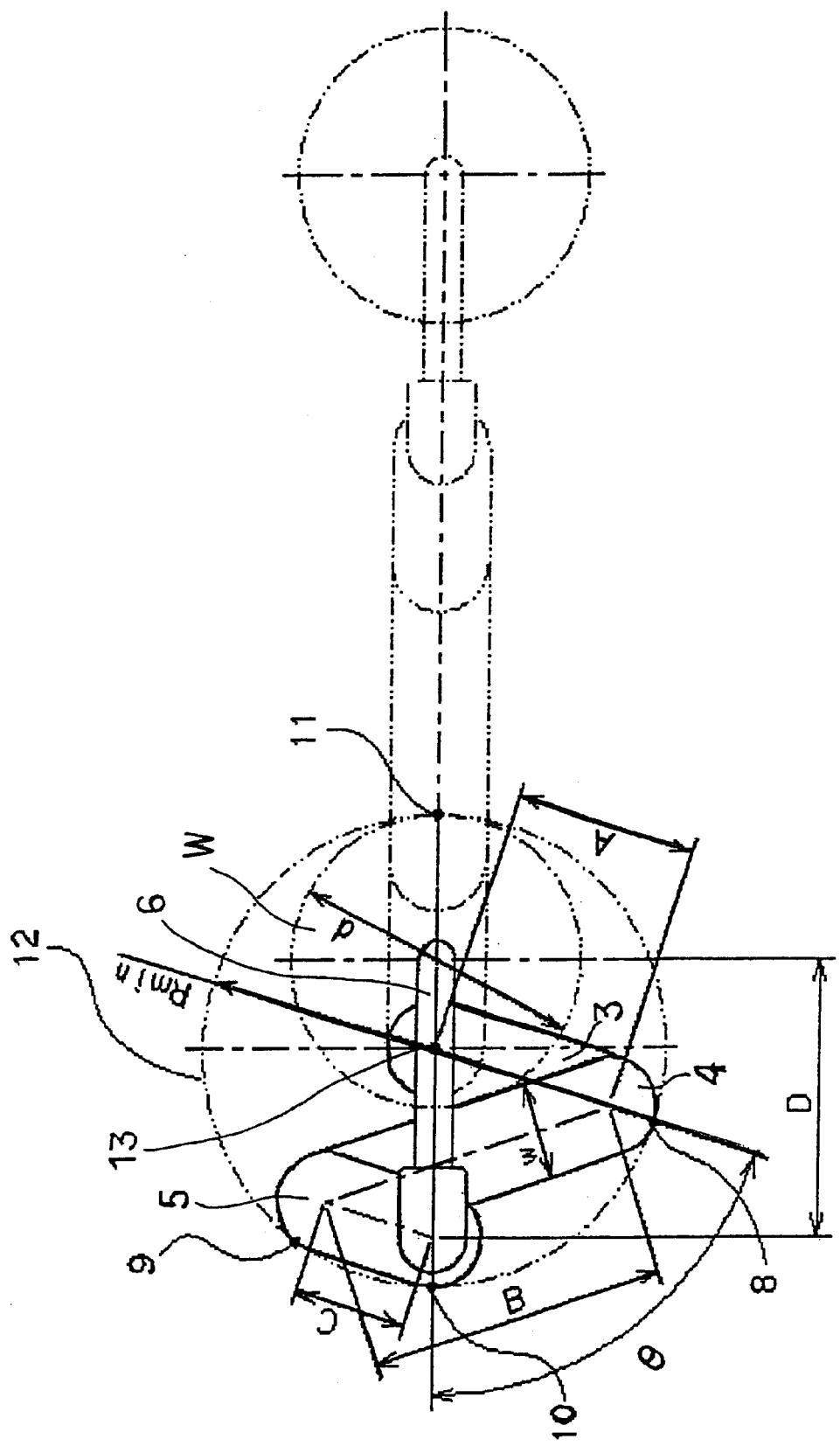
FIG. 2 is a plan view of the substrate transfer system.

FIG. 2 shows a state (shown by solid lines) of the robot hand in a minimum rotational radius, a rotational track (shown by phantom lines) pivoting on a rotational axis 13, and a linear state (shown by phantom lines) of the arms in the substrate transfer system. In the substrate transfer system, the ratio between the arm lengths are calculated so as to inscribe a distal end surface 8 of the first arm 3, a distal end surface 9 of the second arm 4, a distal end surface 10 of the third arm 5, and distal end surface 11 of the workpiece W on a track circle 12 around the rotational axis 13 of the first arm 3 as a center. A radius of the track circle 12 becomes the minimum rotational radius in the substrate transfer system.

Hereinafter, the explanation is given to a calculating method of the minimum rotational radius Rmin, the ratio between arm lengths for obtaining said radius, and a rotational angle θ of the first arm 3. Here, in order for the end effector part including the workpiece W to move in a straight line, it is assumed that rotational speed of the first, second and third arms and end effector is controlled into a ratio of respectively 1:2:2:1 such that the first arm 3 and third arm 5 maintain a parallel state to each other regardless of the rotational angle θ.

The following conditions are given:
A: length of the first arm
B: length of the second arm
C: length of the third arm
D: length of the end effector (const.)
w: width of the arms (const.)
d: diameter of circular thin workpiece (const.)

Since the second arm 4 length equals the sum length of the first and third arms 3 and 5, $$B = A + C \quad \ldots \quad (1)$$

Then, since the minimum rotational radius Rmin equals the length of a line segment between the distal end 8 and the rotational axis 13 of the first arm 3, $$R\text{min} = A + w/2 \quad \ldots \quad (2)$$

Besides, since the minimum rotational radius Rmin equals the length of a line segment between the distal end 10 of the third arm 5 and the rotational axis 13 of the first arm.

$$R\text{min} = A \cdot \cos\theta + B \cdot \cos\theta + C \cdot \cos\theta + w/2 \quad \ldots \quad (3)$$

Further, since the minimum rotational radius Rmin equals a line segment between the distal end 11 of the workpiece W and the rotational axis 13 of the first arm 3, $$R\text{min} = D + d/2 - (A \cdot \cos\theta + B \cdot \cos\theta + C \cdot \cos\theta) \quad \ldots \quad (4)$$

Figure 3:
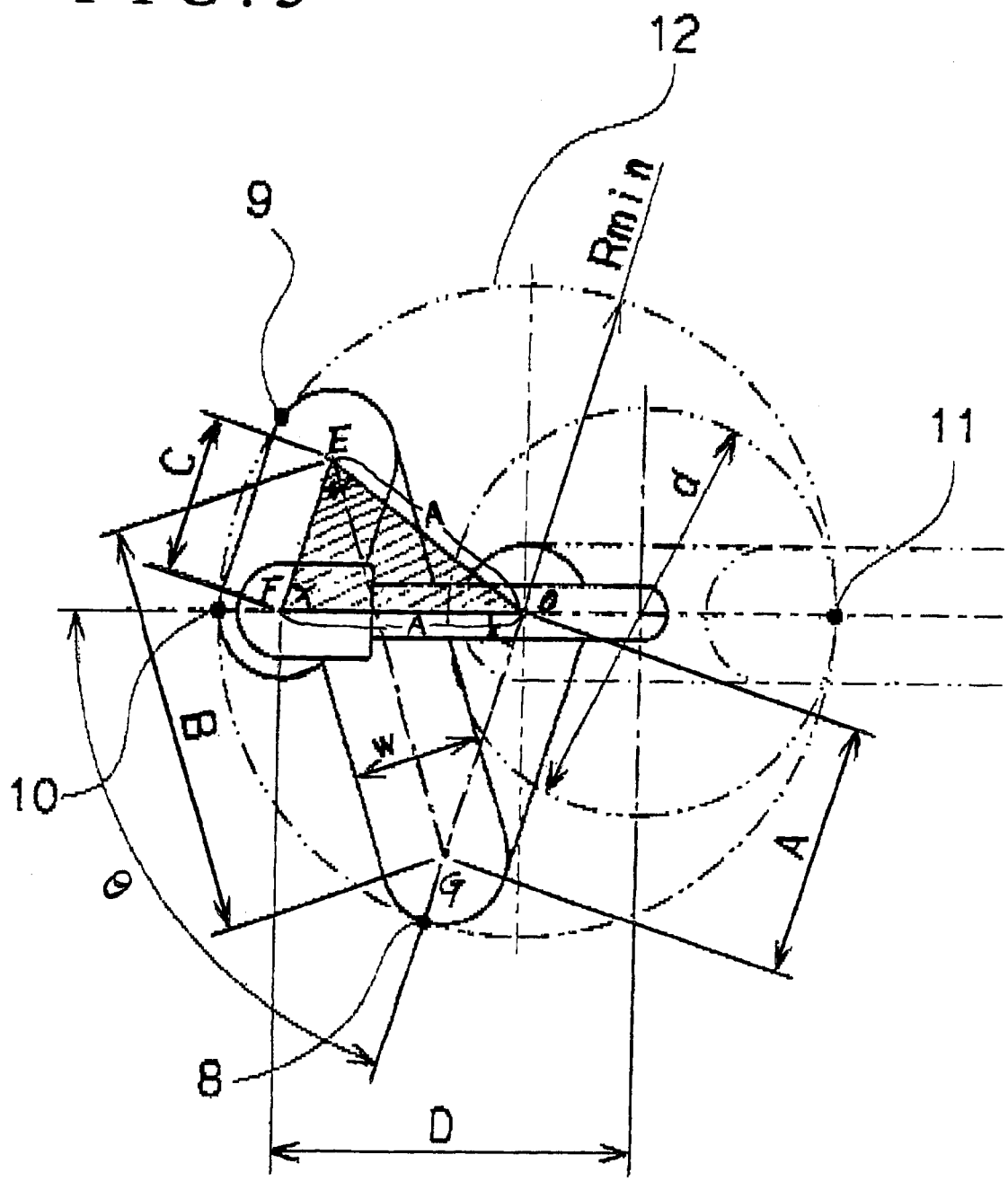
FIG. 3 is a view showing a detail of a segment of the substrate transfer system.

Moreover, in FIG. 3 showing a detail of a segment of FIG. 2, a hatched triangle is an isosceles triangle with respect to an angle EOF as the vertical angle. Since a line segment of equal sides OE and OF of said triangle is A, the following equation is geometrically determined:

$$A \cdot \cos\theta = C/2 \quad \ldots \quad (5)$$

Solving the five simultaneous equations in the condition that each of the first arm 3 length A, second arm 4 length B, third arm 5 length C, minimum rotational radius Rmin and rotational angle θ of the first arm is a variable (here, the first arm 3 length is supposed to be "1") determines the ratio between first, second and third arm lengths as:

$$A:B:C = 1:(\sqrt{5}+1)/2:(\sqrt{5}-1)/2 \, (\approx 1:1.618:0.618),$$

and, the rotational angle θ becomes:

$$\theta = 72°$$

Especially, as to the ratio between the arms, the following equations hold:

$$A:C = B:A$$

$$A:C = (A+C):A$$

This condition fits a section ratio generally known as "golden section". Consequently, concerning the ratio between the first arm 3 length and the third arm 5 length with respect to the second arm 4 length, the longer portion of the divided second arm 4 length according to "golden section" becomes the first arm 3 length, and the lesser portion of it becomes the third arm 5 length.

Further, since the minimum rotational radius Rmin is determined by the end effector length D, width w of the arm and diameter d of the circular thin workpiece, $$R\text{min} = (2D + w + d)/2$$

Figure 4:
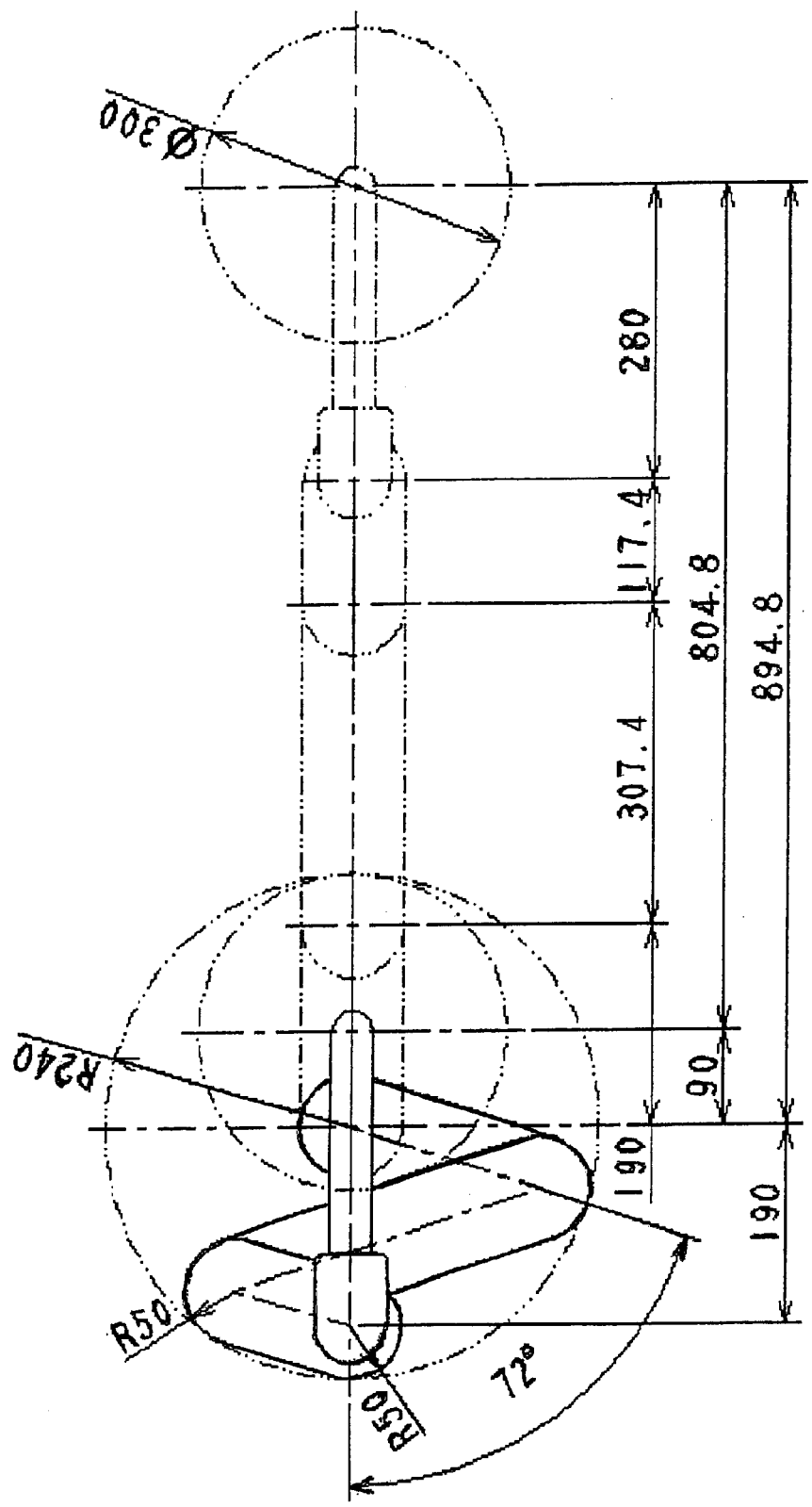
FIG. 4 is a plan view in which dimensions are described in the substrate transfer system.
Figure 9:
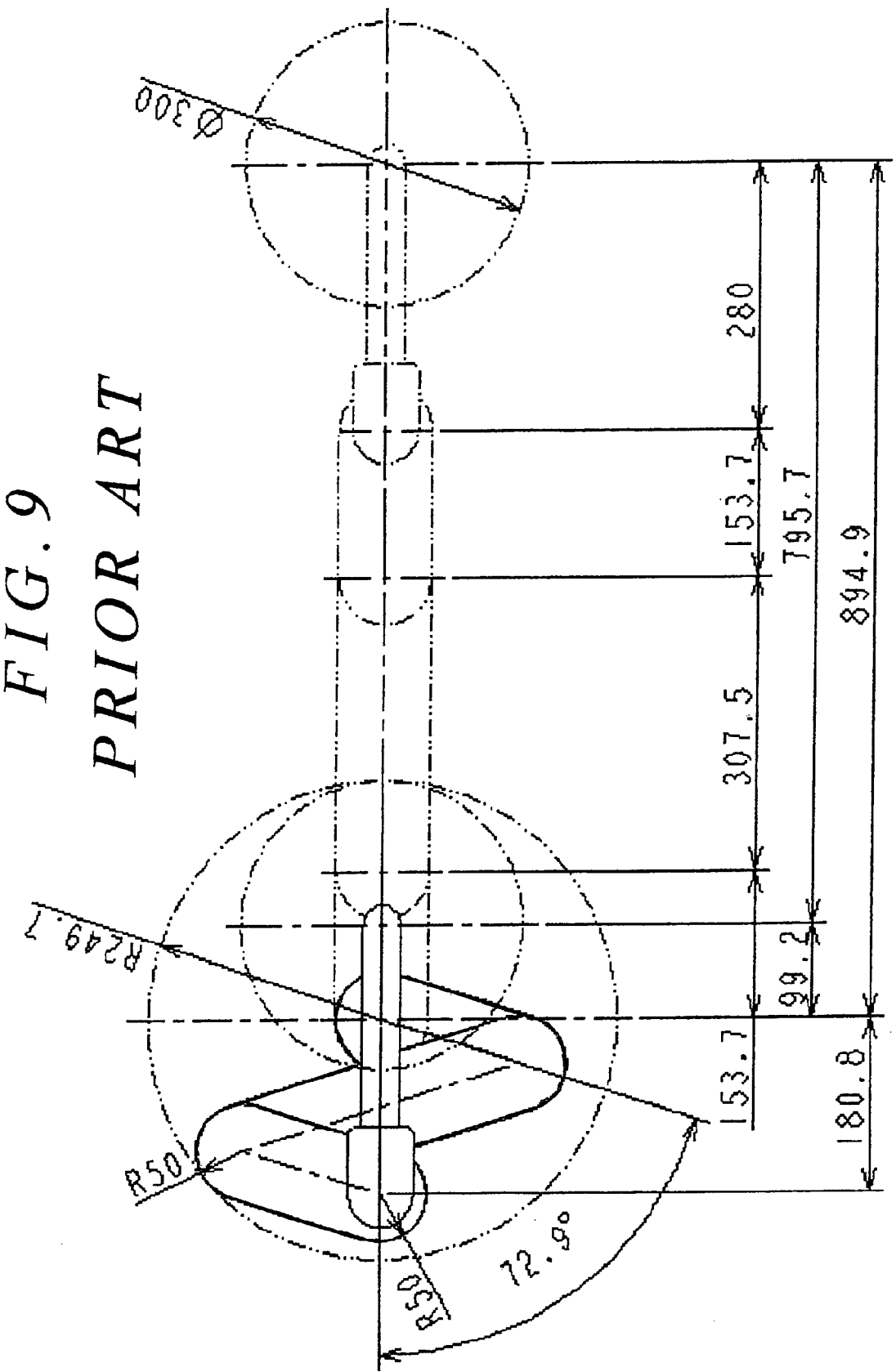
FIG. 9 is a plan view in which dimensions are described in the conventional substrate transfer system.
Figure 10:
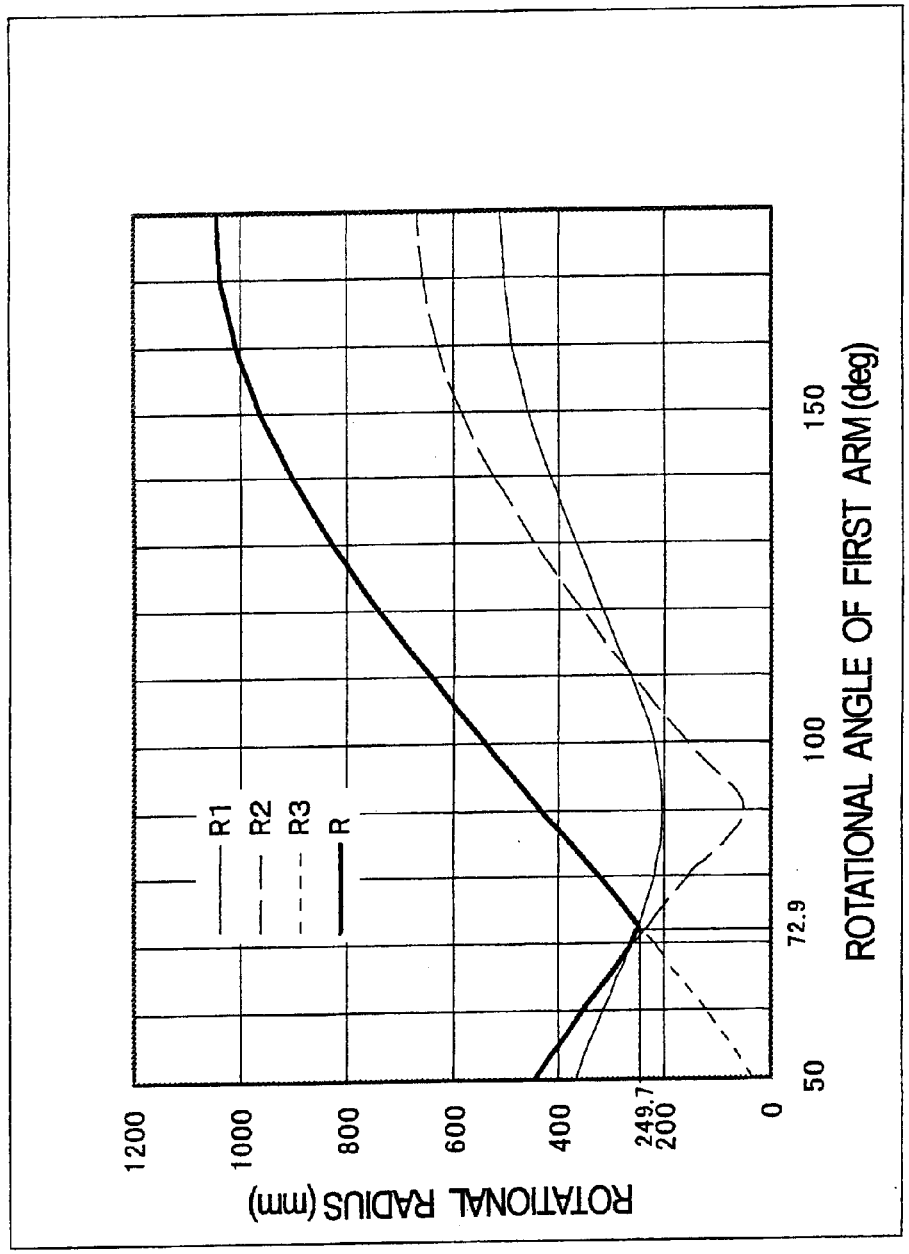
FIG. 10 is a graph indicating changes of rotational radius with respect to rotational angles of a first arm in the conventional substrate transfer system.

Next, for the purpose of indicating an improvement owing to the present invention beyond the conventional art in the minimum rotational radius, FIG. 4 shows an example that the present invention is employed in the ratio between the arm lengths in the condition that the workpiece transfer distance and end effector length are equal to those of the conventional system shown in FIG. 9. In this example, the minimum rotational radius Rmin is 240 mm, which allows the reduction of the rotational radius by 10 mm as compared with the conventional manner shown in FIG. 9.

Figure 5A:
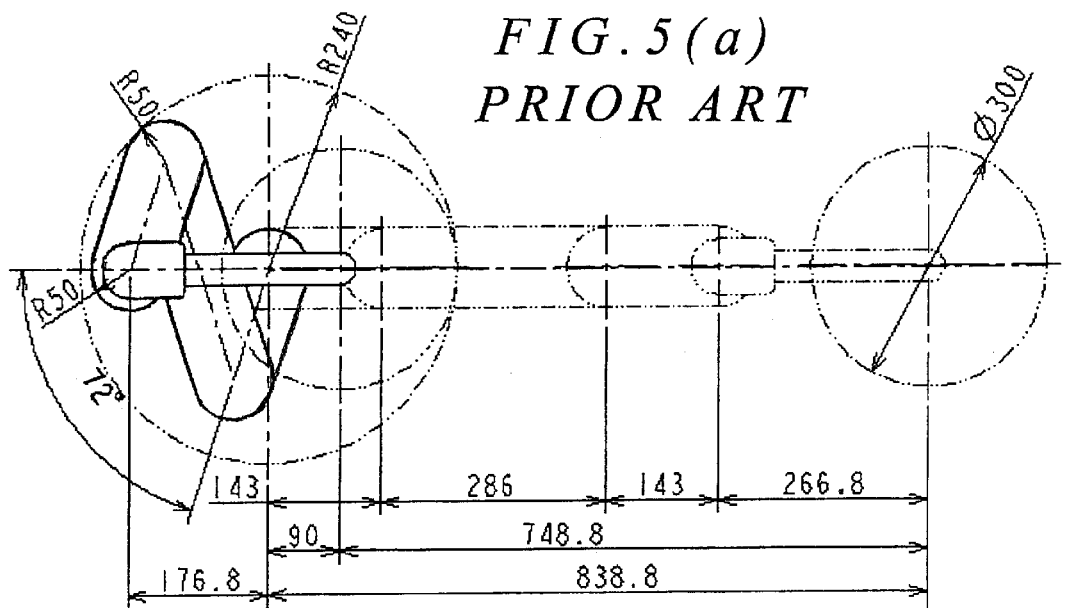
FIG. 5(a) is a view showing a substrate transfer system according to a conventional manner.
Figure 5B:
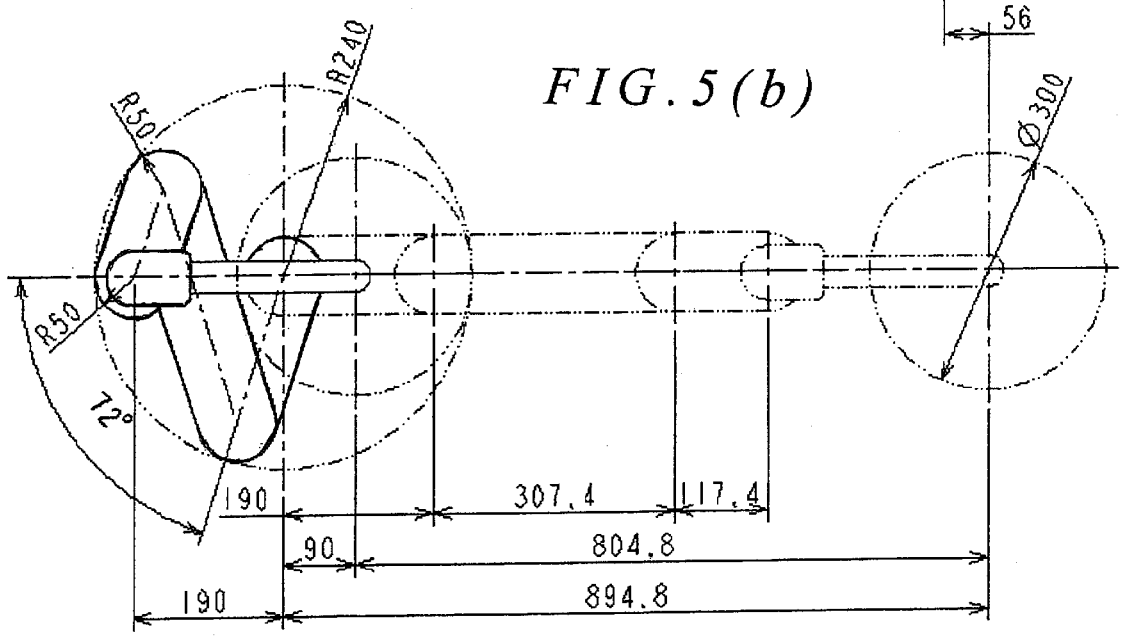
FIG. 5(b) is a view showing a view explaining an improvement of the substrate transfer system according to the present invention.
Figure 6:
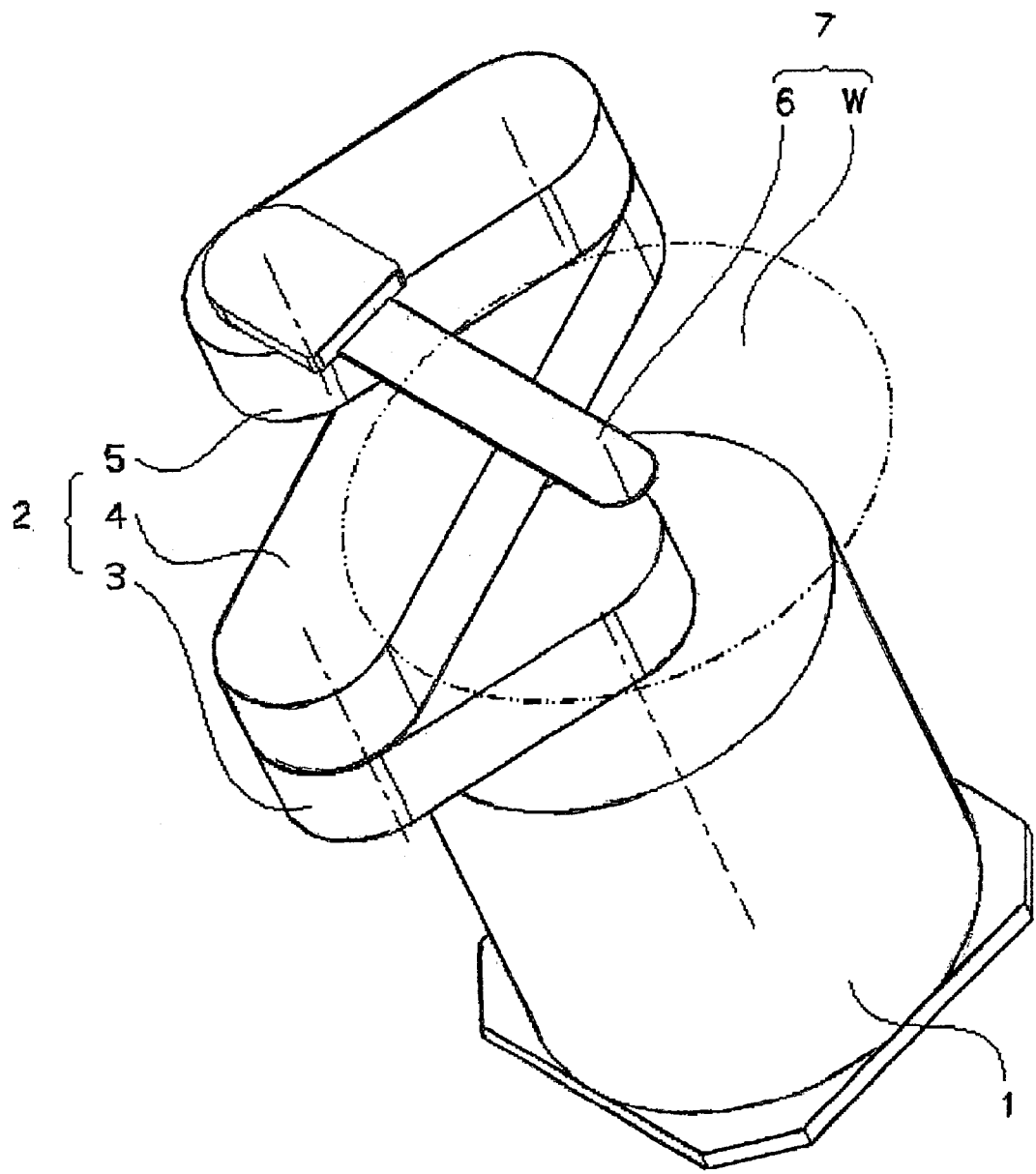
FIG. 6 is a perspective view of the conventional substrate transfer system.
Figure 7:
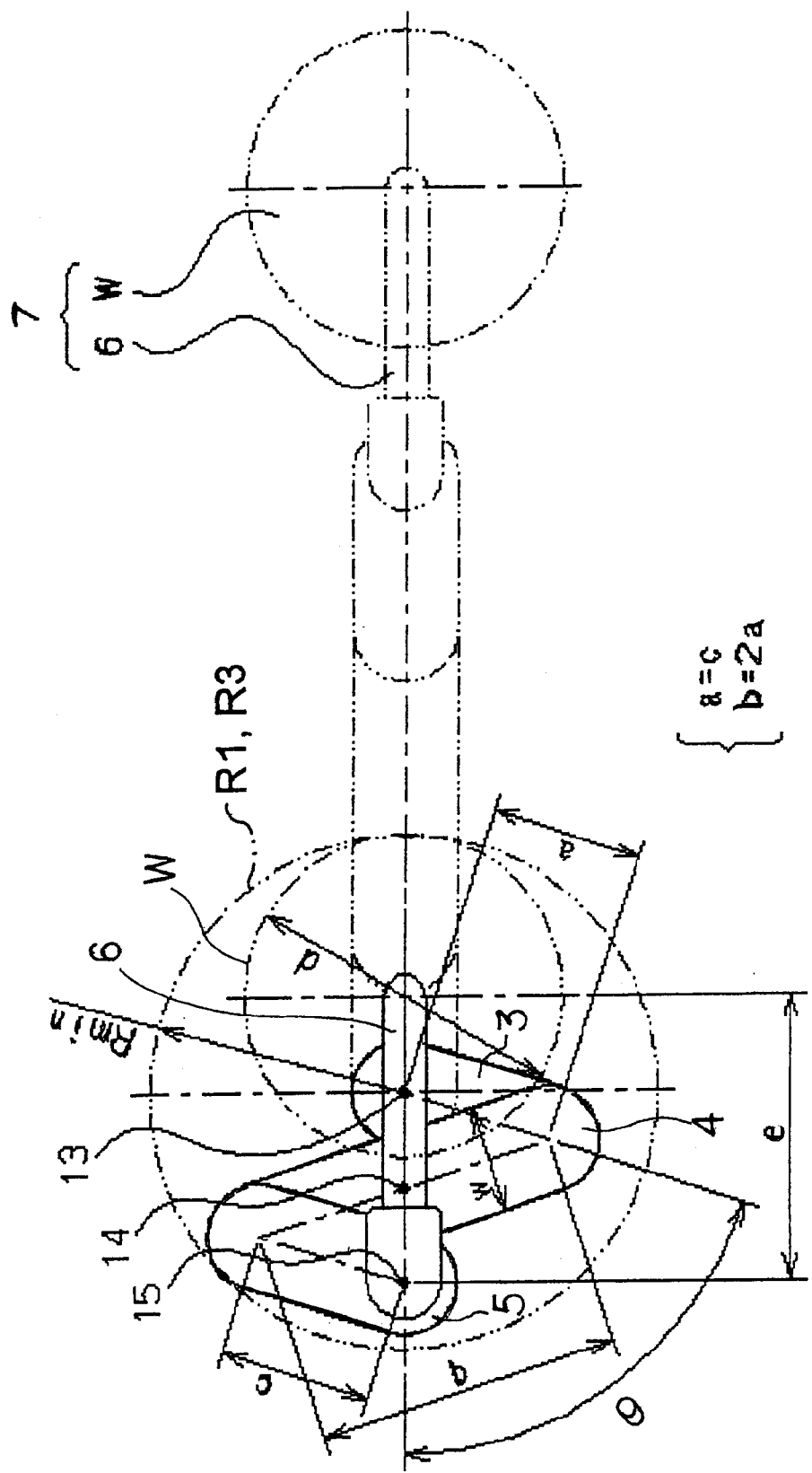
FIG. 7 is a plan view of the conventional substrate transfer system.
Figure 8A:
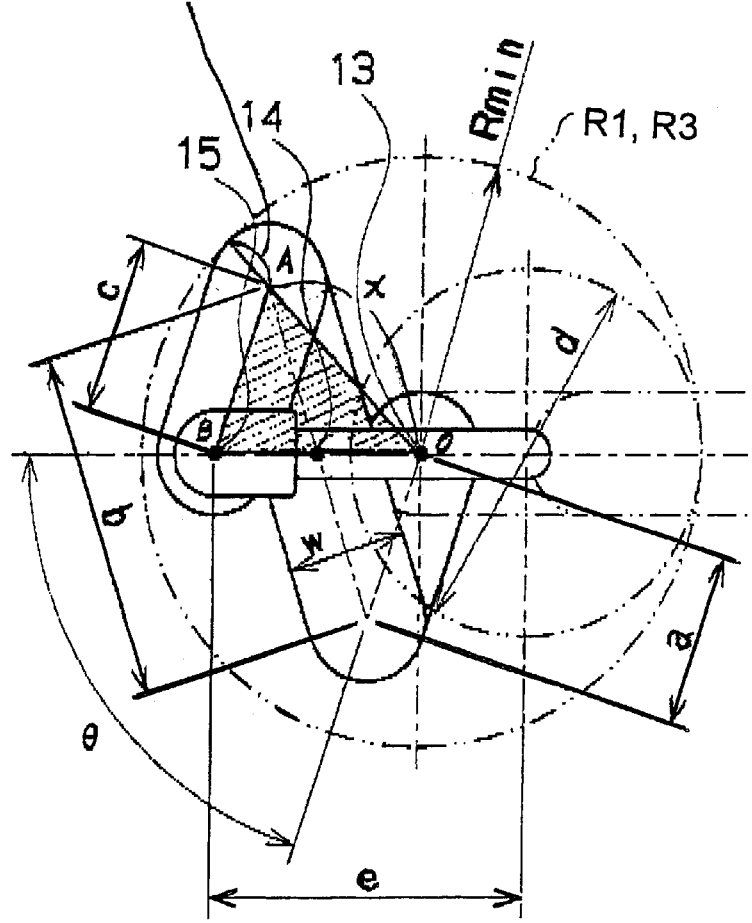
FIGS. 8(a) and 8(b) are views showing details of segments of the conventional substrate transfer system.
Figure 8B:
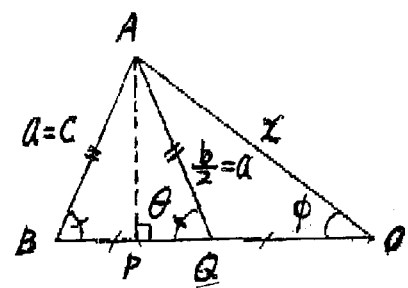

Further, FIGS. 5(*a*) and 5(*b*) show a comparison of the workpiece transfer distance in the same minimum rotational radius between the conventional art and present invention respectively. As shown in the figures, the present invention makes it possible to extend the transfer distance by 56 mm as compared with the conventional manner.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims. For example, the ratio between the first, second and third arm lengths can assume respectively 1:1.6:0.6 or 1:1.5:0.5 and so forth including values approximate to the above-described values.

What is claimed is:

1. A substrate transfer system which transfers a workpiece, comprising:
   a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm; and
   wherein a sum length of the first arm and third arm is equal to a length of the second arm, and a length of the first arm is longer than a length of the third arm.

2. A substrate transfer system which transfers a workpiece, comprising:
   a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm;

wherein a ratio between lengths of the first, second and third arms is determined such that a distal end portion of the first arm, a distal end portion of the second arm, a distal end portion of the third arm, and a distal end portion of the workpiece held by the end effector are positionable on a track circle around a rotational axis of the first arm as a center; and wherein the ratio between each of the lengths of the first, second and third arms is approximately $1:(\sqrt{5}+1)/2:(\sqrt{5}-1)/2$.

3. A substrate transfer system which transfers a workpiece, comprising:

a link structure including a first arm which is rotatably supported by a base, a second arm which is rotatably supported by a distal end portion of said first arm, a third arm which is rotatably supported by a distal end portion of said second arm, and an end effector for supporting the workpiece, which is rotatably supported by a distal end portion of said third arm;

wherein a ratio between lengths of the first, second and third arms is determined such that a distal end portion of the first arm, a distal end portion of the second arm, a distal end portion of the third arm, and a distal end portion of the workpiece held by the end effector are positionable on a track circle around a rotational axis of the first arm as a center; and wherein the ratio between each of arm lengths is approximately determined such that a longer portion of the second arm length as divided according to a "golden section" is the first arm length, and a lesser portion of the second arm length is the third arm length.

* * * * *